(12) United States Patent
Inoue et al.

(10) Patent No.: US 7,304,337 B2
(45) Date of Patent: Dec. 4, 2007

(54) SEMICONDUCTOR DEVICE

(75) Inventors: Susumu Inoue, Atsugi (JP); Yo Takeda, Shonai (JP); Yutaka Maruo, Sakata (JP)

(73) Assignee: Seiko Epson Corporation (JP)

( * ) Notice: Subject to any disclaimer, the term of this patent is extended or adjusted under 35 U.S.C. 154(b) by 81 days.

(21) Appl. No.: 11/287,710

(22) Filed: Nov. 28, 2005

(65) Prior Publication Data

US 2006/0131623 A1 Jun. 22, 2006

(30) Foreign Application Priority Data

Dec. 21, 2004 (JP) .............................. 2004-369588

(51) Int. Cl.
*H01L 31/062* (2006.01)
*H01L 31/113* (2006.01)
*H01L 29/06* (2006.01)
*H01L 31/0328* (2006.01)
*H01L 31/0336* (2006.01)

(52) U.S. Cl. .......................... 257/290; 257/13; 257/81; 257/184

(58) Field of Classification Search ................ 257/290, 257/13, 21, 81, 184, 79, 211
See application file for complete search history.

(56) References Cited

U.S. PATENT DOCUMENTS 6,078,070 A * 6/2000 Robinson ..................... 257/280
2005/0211993 A1* 9/2005 Sano et al. ..................... 257/79

FOREIGN PATENT DOCUMENTS

JP 2003-124363 4/2003

* cited by examiner

*Primary Examiner*—Chuong A. Luu
(74) *Attorney, Agent, or Firm*—Harness, Dickey & Pierce, P.L.C.

(57) ABSTRACT

A semiconductor device includes: a semiconductor element provided on a semiconductor layer; a light-blocking wall provided around the semiconductor element; and a wiring layer electrically coupled to the semiconductor element and extended from an aperture not having the light-blocking wall to an outside of the light-blocking wall; wherein the wiring layer has a pattern containing a first section positioned in the aperture and a second section which has a width not narrower than a width of the aperture by providing a branched portion intersecting with an extension direction of the wiring layer; and wherein a surface of the branched portion facing outside of the light-blocking wall includes thereon a convex part.

3 Claims, 8 Drawing Sheets

(A)

(B)

(A)

(B)

(C)

(A)

(B)

(C)

(A)

(B)

SEMICONDUCTOR DEVICE

The entire disclosure of Japanese Patent Application No. 2004-369588, filed Dec. 21, 2004 is expressly incorporated by reference herein.

BACKGROUND

1. Technical Field

The present invention relates to a semiconductor device containing a semiconductor element having characteristics changeable upon receipt of light.

2. Related Art

Semiconductor elements whose characteristics change upon receipt of light are, for example, a MOS transistor and a nonvolatile memory having a floating gate electrode. If these semiconductor elements receive incident light while packaging a bear chip or the like by a COG packaging method, in particular, the MOS transistor may change its on/off characteristics, and the nonvolatile memory may lose electrons injected into the floating gate electrode. In order to avoid these characteristic changes in the semiconductor elements, a light blocking layer to prevent irradiation of light is provided in the upper part of a region where these devices are provided.

One technique for blocking the light is disclosed in JP-A-2003-124363. In JP-A-2003-124363, a light-blocking region is provided surrounding a memory cell array effective region and its periphery and has a via layer and a contact layer provided at different levels. These via layer and contact layer are arranged in zigzag so as to suppress the light entering from lateral and diagonal directions.

However, even when the blocking region is provided surrounding the memory cell array effective region in order to reduce the light entering from the diagonal and lateral directions, there is a need, for example, to extend wires such as a signal line to outside the light-blocking region. Therefore, the via layer and the contact layer arranged in zigzag may not be able to completely surround the memory cell array effective region.

SUMMARY

An advantage of the invention is to provide, in particular, a semiconductor device that can reduce the light entering from lateral and diagonal directions and can suppress changes in the characteristics.

1. First Semiconductor Device

According to an aspect of the invention, a first semiconductor device includes: a semiconductor element provided on a semiconductor layer; a light-blocking wall provided surrounding the semiconductor element; and a wiring layer electrically coupled to the semiconductor element and extended from an aperture not having the light-blocking wall to an outside of the light-blocking wall; wherein the wiring layer has a pattern containing a first section positioned in the aperture and a second section which has a width not narrower than a width of the aperture by providing a branched portion intersecting with an extension direction of the wiring layer; and wherein a surface of the branched portion facing outside of the light-blocking wall includes thereon a convex part.

According to the first semiconductor device of the invention, because the light-blocking wall is provided surrounding the semiconductor element, it is possible to reduce the light irradiated on the semiconductor device from the lateral and upper diagonal directions. Further, each type of the semiconductor elements is coupled with wires, which need to be extended to the outside of the region surrounded by the light-blocking wall. In this case, the aperture may be provided in a portion of the light-blocking wall so as to draw the wires outside of this aperture. However, the light may enter from this aperture and may affect the characteristics of the semiconductor elements.

However, according to the semiconductor device of the invention, the second section, which is the wiring layer positioned outside the aperture, includes the pattern having the width not narrower than, the width of the aperture. Therefore, the laterally entering light can be reduced. Further, the surface of the branched portion as a part of the second section that faces outside of the light-blocking region, that is, the side surface of the branched portion facing the light entering direction, has the convex part thereon. Thus, it is possible to reflect even the light that enters diagonally towards the aperture, enabling further reduction of the entering light. As a result, the characteristic changes can be suppressed, and the semiconductor device with improved reliability can be provided.

The first semiconductor device of the invention can further have structures as below.

(1) With the first semiconductor device, the convex part may have a pointed configuration.

(2) With the first semiconductor device, the convex part may be arranged in line.

2. Second Semiconductor Device

According to another aspect of the invention, a second semiconductor device includes: a semiconductor element provided on a semiconductor layer; a light-blocking wall provided around the semiconductor element; and a wiring layer electrically coupled to the semiconductor element and extended from an aperture not having the light-blocking wall to an outside of the light-blocking wall; wherein the wiring layer has a pattern containing a first section positioned in the aperture and a second section which has a width not narrower than a width of the aperture by providing a branched portion intersecting with an extension direction of the wiring layer; and wherein a surface of the second section facing outside of the light-blocking wall is in a concave configuration.

According to the second semiconductor device of the invention, similarly to the first semiconductor device, it is possible to reduce the light entering from the lateral direction. Further, the surface of the second section facing outside of the light-blocking wall is in the concave configuration. Accordingly, regardless the size of the angle of the incident light entering into the aperture, the semiconductor device can reflect the light and can further reduce the entering light. As a result, the characteristic changes can be suppressed, and it is possible to provide the semiconductor device with the improved reliability.

The second semiconductor device of the invention can have structures as below.

(1) With the second semiconductor device, the concave configuration may be a concave curve.

(2) With the second semiconductor device, the branched portion may be in a configuration having a length that becomes larger towards the tip of this branched portion.

BRIEF DESCRIPTION OF THE DRAWINGS

The invention will be described with reference to the accompanying drawings, wherein like numbers reference like elements.

DESCRIPTION OF THE EMBODIMENTS

Embodiments of the invention will now be described.

1. First Embodiment

Figure 1:
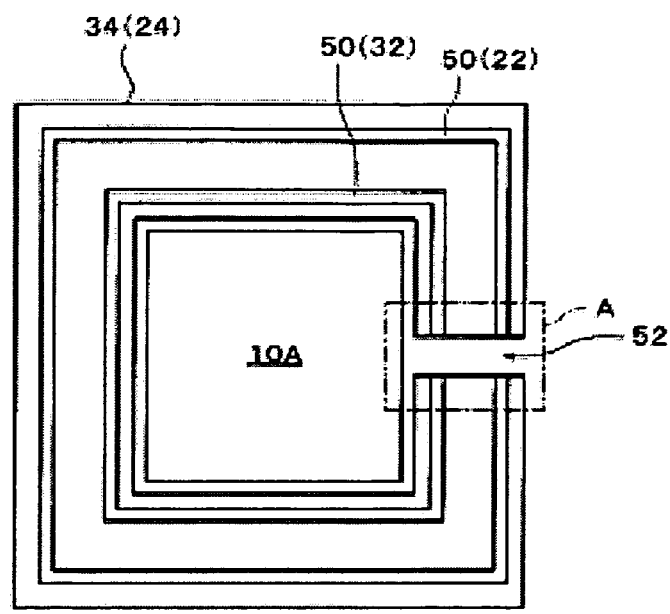
FIG. 1A is a plan pattern view of a semiconductor device of a first embodiment.
FIG. 1B is a plan view of an enlarged portion A of FIG. 1A.
Figure 1:
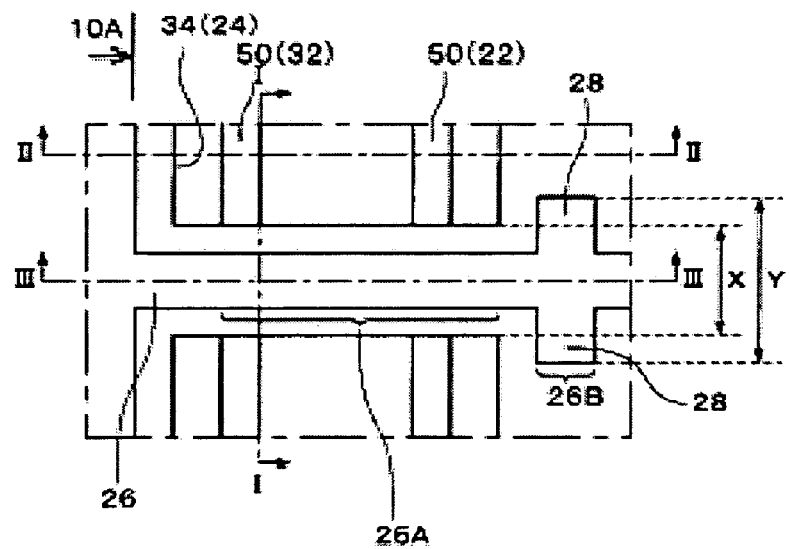
Figure 2:
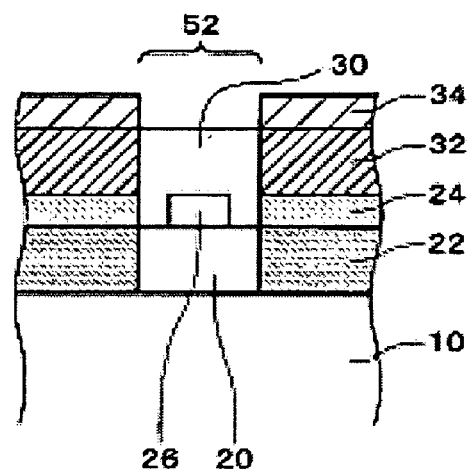
FIG. 2A is a cross sectional diagram taken on a line I-I of FIG. 1B.
FIG. 2B is a cross sectional diagram taken on a line II-II of FIG. 1B.
FIG. 2C is a cross sectional diagram taken on a line III-III of FIG. 1B.
Figure 2:
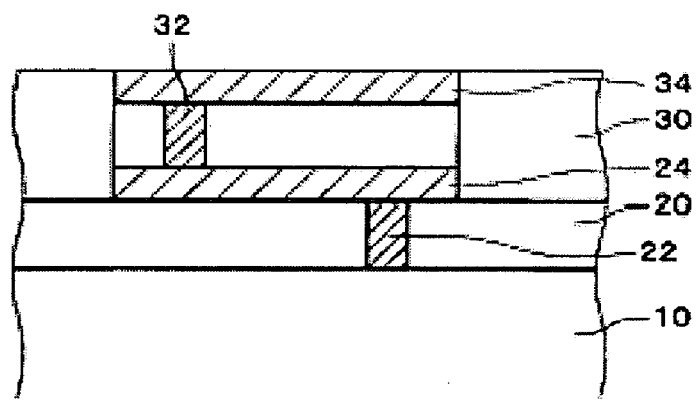
Figure 2:
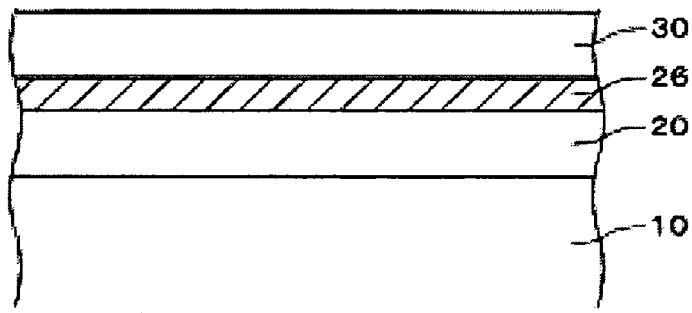

The semiconductor device of the first embodiment will be described with reference to FIGS. 1 and 2. FIG. 1A is a plan pattern view of the semiconductor device of the present embodiment; and FIG. 1B is a plan view of an enlarged portion A of FIG. 1A. FIG. 2A is a cross sectional diagram taken on a line I-I of FIG. 1B; FIG. 2B is a cross sectional diagram taken on a line II-II of FIG. 1B; and FIG. 2C is a cross sectional diagram taken on a line III-III of FIG. 1B.

As shown in FIG. 1A, the semiconductor device of the embodiment includes an element formation region 10A containing various types of semiconductor elements (not shown) on the semiconductor layer. The element formation region 10A is provided with elements such as a nonvolatile memory cell (including a memory array) having a floating gate electrode and a MOS transistor, whose characteristics change upon receipt of light. Further, the element formation region 10A is surrounded by a light-blocking wall 50. This light-blocking wall 50 is provided so as to reduce the light entering into the element formation region 10A from lateral and diagonal directions. The light-blocking wall 50 has a part where there is no light-blocking wall 50 in order to let a wiring layer region 10A extend to the outside of the element formation region 10A. The following is a description of this part having no light-blocking wall 50 which is defined as an aperture 52.

The aperture 52 will be described with reference to FIG. 1B, which is an enlarged diagram of a region including the aperture 52.

As shown in FIG. 1B, the wiring layer 26 is drawn outside the element formation region 10A from the aperture 52. The wiring layer 26 includes a pattern containing a first section 26A provided in the aperture 52 and a second section 26B which is provided outside the aperture 52 and has a width larger than the width of the first section 26A. In the embodiment, it is illustrated that the second section 26B is provided outside the aperture 52 on the outside of the element formation region 10A. Here, the width of the aperture 52 is a distance X between one end and the other end of the light-blocking wall 50 that delimits the aperture 52. Also, the width of the wiring layer 26 is a distance Y between one end and the other end of the wiring layer 26 when seen in a direction perpendicular to an extension direction of the wiring layer 26.

More specifically, with the semiconductor device of the embodiment, the width of the second section 26B is made large by providing a branched portion 28 so as to intersect with an axis, the axis being the extension direction of the wiring layer 26.

By thus providing the branched portion 28, the second section 26B is provided overlapping the aperture 52, and, further, the width Y and the width X of the aperture 52 fulfill the relationship $X \leq Y$.

Next, a cross sectional structure of the semiconductor device will be described with reference to FIGS. 2A to 2C.

First, the structure of the light-blocking wall 50 will be described with reference particularly to FIGS. 2A and 2B. As shown in FIG. 2B, there are a first interlayer insulating layer 20 and a second interlayer insulating layer 30 provided, in this order, on a semiconductor layer 10. There are a first metal layer 24 on the first interlayer insulating layer 20 and a second metal layer 34 on the second interlayer insulating layer 30. The semiconductor layer 10 and the first metal layer 24 are coupled by a contact layer 22 provided in the first interlayer insulating layer 20. The first metal layer 24 and the second metal layer 34 are coupled by a via layer 32 provided in the second interlayer insulating layer 30.

The contact layer 22 and the via layer 32 are layers formed, for example, by burying a light-blocking material such as a conductive layer into opening portions 22a and 32a provided in the first and second interlayer insulating layers 20 and 30, respectively. The opening portions 22a and 32a are groove-like openings continuously surrounding the semiconductor element except for the region that becomes the aperture 52. Thus, as shown in FIG. 2A, the entire contact layer 22 and via layer 32 provided on different levels are made like walls covering the element formation region 10A. That is to say, the light-blocking wall 50 of the semiconductor device of the first embodiment is composed of the first metal layer 24, the contact layer 22, the second metal layer 34, and the via layer 32.

Next, as shown in FIG. 2C, in the region having the aperture 52, the first interlayer insulating layer 20 and the second interlayer insulating layer 30 are provided, in this order, on the semiconductor layer 10, and the wiring layer 26 is provided on the first interlayer insulating layer 20.

According to the semiconductor device of the embodiment, because the light-blocking wall 50 is provided around the semiconductor device, it is possible to reduce the light entering from the lateral and diagonal directions. Further, because the pattern of the wiring layer 26 is controlled by providing the second section 26B covering the aperture 52, the light entering from the aperture 52 can be reduced when drawing out the wiring layer 26, which is coupled with various semiconductor elements, from the aperture 52 of the light-blocking wall 50. As a result, the characteristic changes can be suppressed, and it is possible to provide the semiconductor device with the improved reliability.

2. Second Embodiment

Figure 3:
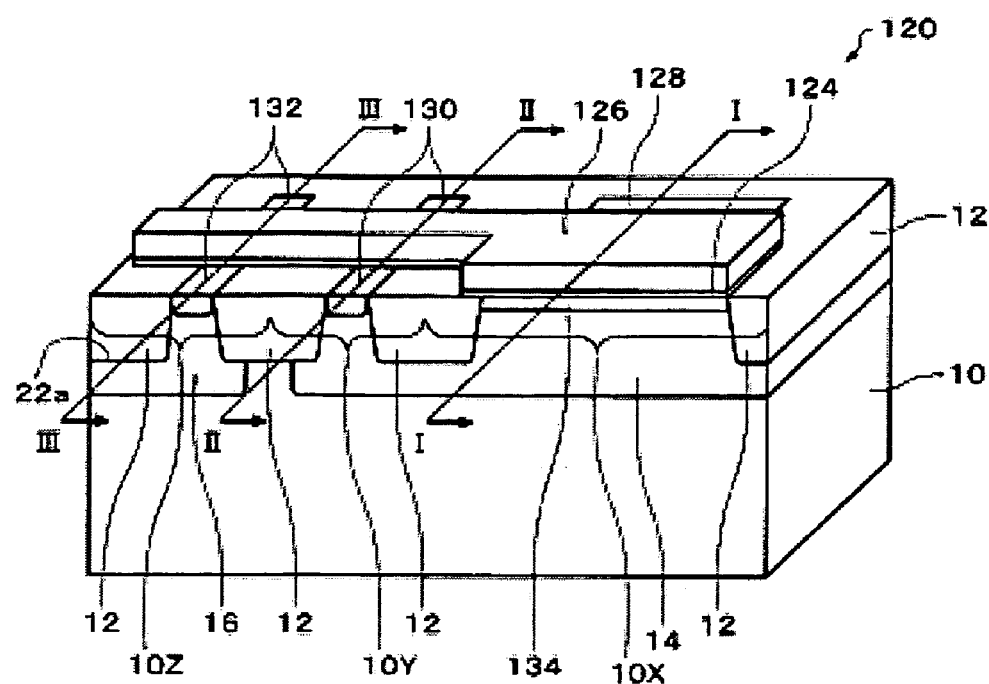
FIG. 3 is a perspective view of a memory cell provided in the semiconductor device of a second embodiment.
Figure 4:
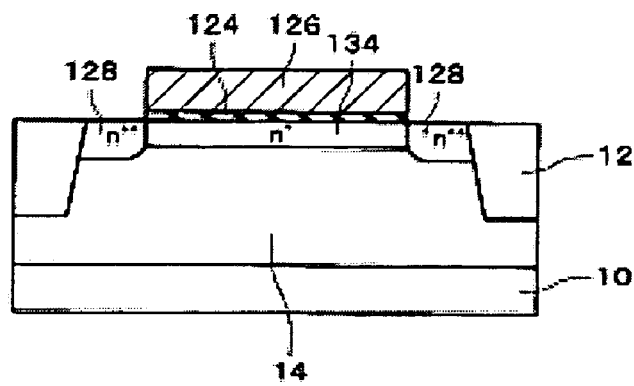
FIG. 4A is a cross sectional diagram taken on a line I-I of FIG. 3.
FIG. 4B is a cross sectional diagram taken on a line II-II of FIG. 3.
FIG. 4C is a cross sectional diagram taken on a line III-III of FIG. 3.
Figure 4:
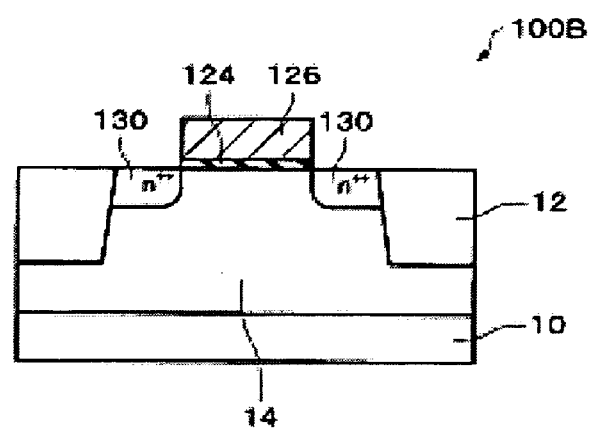
Figure 4:
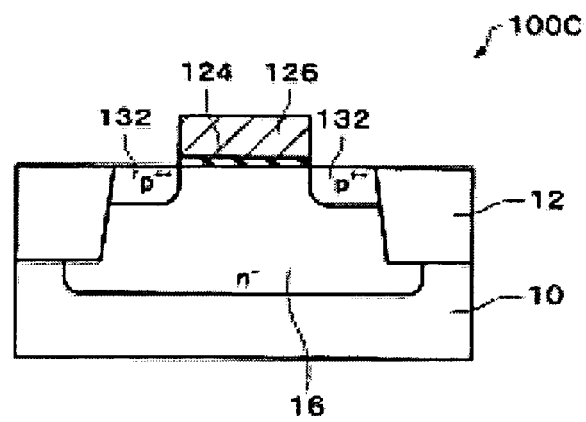
Figure 5:
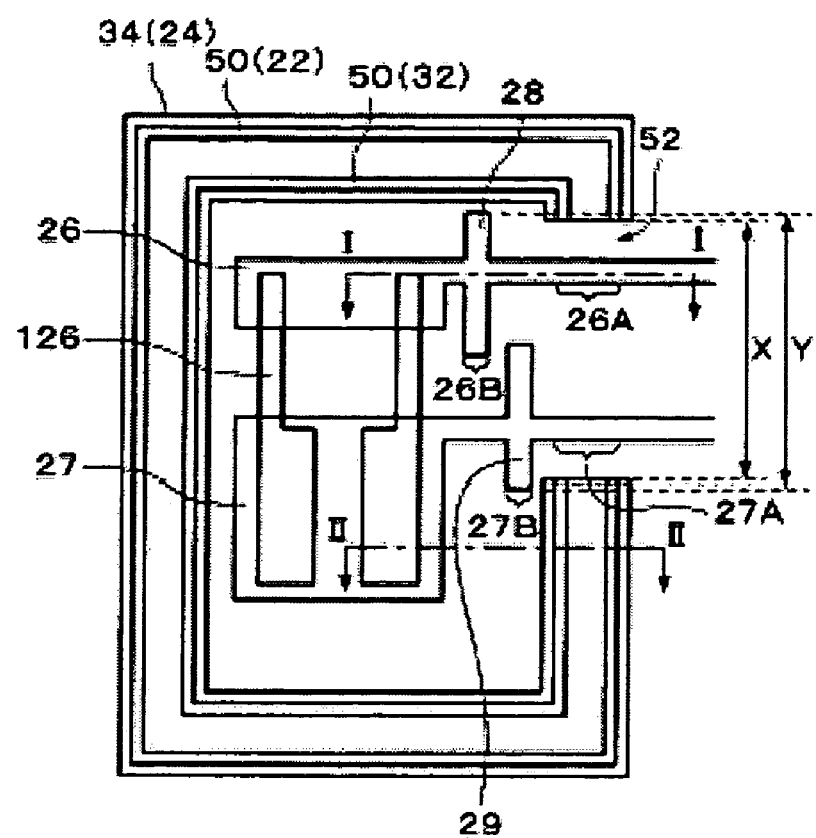
FIG. 5 is a plan pattern view of the semiconductor device of the second embodiment.
Figure 6:
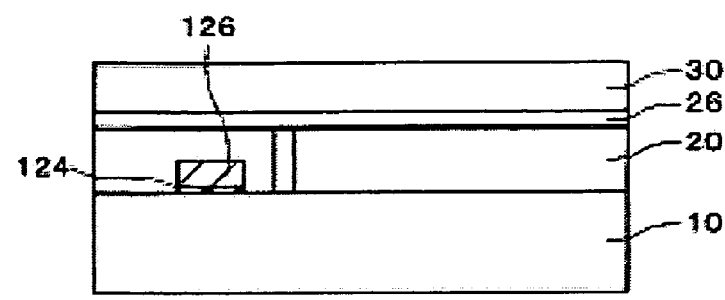
FIG. 6A is a cross sectional diagram taken on a line I-I of FIG. 5.
FIG. 6B is a cross sectional diagram taken on a line II-II of FIG. 5.
Figure 6:
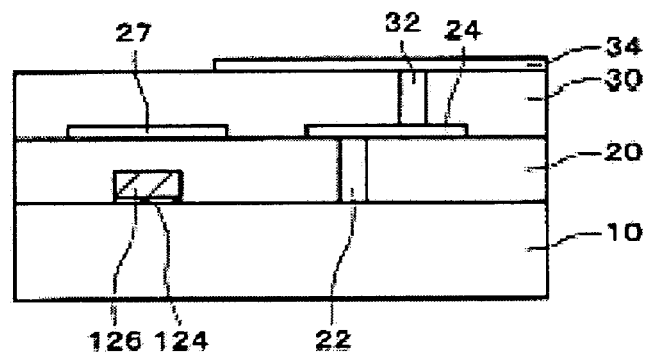
Figure 7:
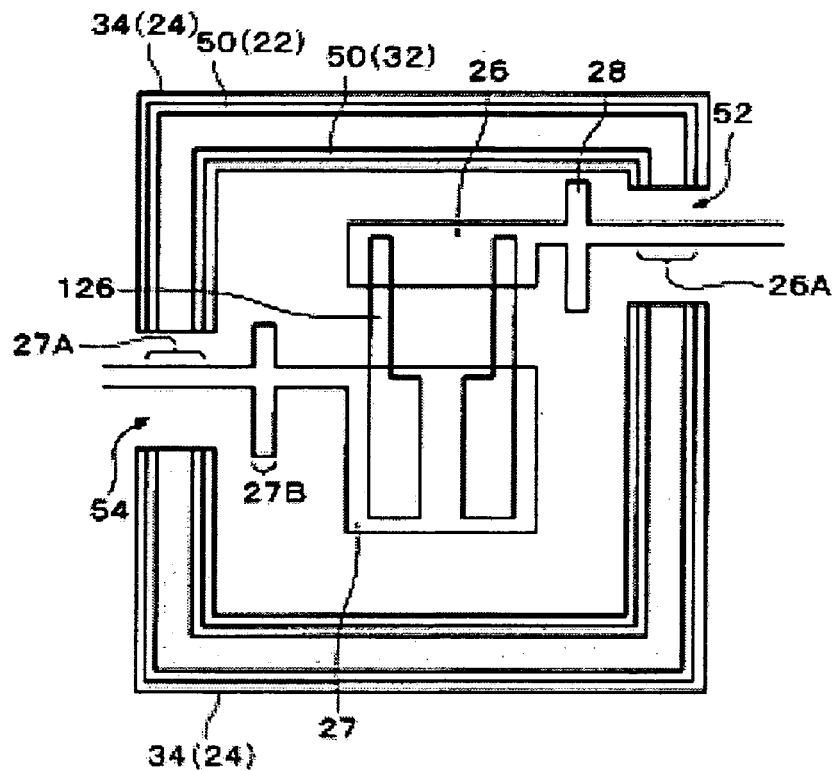
FIG. 7 is a plan view of the semiconductor device of a modified example of the second embodiment.

Now, the second embodiment will be described with reference to FIGS. 3 to 7. FIGS. 3 and 4 are diagrams to explain the nonvolatile memory cell (hereinafter referred to as the "memory cell") provided in the element formation region 10A of the semiconductor device of the second embodiment. FIG. 5 is a plan pattern view of the semiconductor device of the second embodiment. FIG. 6A is a cross sectional diagram taken on a line I-I of FIG. 5, and FIG. 6B is a cross sectional diagram taken on a line II-II of FIG. 5. FIG. 7 is a plan view of a modified example of the semiconductor device of the second embodiment.

First, the memory cell, which is the semiconductor element to be provided in the element formation region 10A, will be described.

With a memory cell 120 contained in the semiconductor device of the present embodiment, the control gate is an n-type impurity region within the semiconductor layer 10, and the floating gate electrode is composed of a conductive layer such as a single layer polysilicon layer (hereinafter possibly referred to as "a single-layer gate type nonvolatile memory device"). FIG. 3 is a perspective view of the memory cell. FIG. 4A is a cross sectional diagram taken on a line I-I of FIG. 3; FIG. 4B is a cross sectional diagram taken on a line II-II of FIG. 3; and FIG. 4C is a cross sectional diagram taken on a line III-III of FIG. 3.

As shown in FIG. 3, the memory cell 120 of the embodiment is provided on the p-type semiconductor layer 10. The semiconductor layer 10 is delimited and separated into a first region 10X, a second region 10Y, and a third region 10Z by element separation insulating layers 12. The first region 10X and the second region 10Y are provided in a p-type well 14. The third region 10Z is provided in an n-type well 16. The first region 10X is a control gate section; the second region 10Y is a write section; and the third region 10Z is an erase section.

There is an insulating layer 124 on the first to third regions 10X to 10Z of the semiconductor layer 10. On the insulating layer 124, there is a floating gate electrode 126 spreading from the first to third regions 10X to 10Z.

Next, a cross sectional structure of each of these regions will be described. As shown in FIG. 4A, the first region 10X includes: the insulating layer 124 provided on the well 14, the floating gate electrode 126 provided on the insulating layer 124, and an n-type impurity region 134 provided on the semiconductor layer 10 under the floating gate electrode 126, and an n-type impurity region 128 provided adjacent to the impurity region 134. The n-type impurity region 134 plays a role of the control gate, and the impurity region 128 is electrically coupled to a control gate line and becomes a contact section for applying voltage to the control gate.

As shown in FIG. 4B, there is an n-channel type MOS transistor 100B for writing into the memory cell 120 in the second region 10Y. The n-channel type transistor 100B includes: the insulating layer 124 provided on the well 14, the floating gate electrode 126 provided on the insulating layer 124, and an impurity region 130 provided in the semiconductor layer 10. The impurity region 130 becomes a source region or a drain region.

As shown in FIG. 4C, there is a p-channel type transistor 100C provided in the third region 10Z. The p-channel type transistor 100C includes: the insulating layer 124 provided on the n-type well 16, the floating gate electrode 126 provided on the insulating layer 124, and an impurity region 132 provided in the n-type well 16. The impurity region 132 becomes the source region or the drain region.

Next, with reference to FIG. 5, the semiconductor device of the embodiment will be described. Note that FIG. 5 only shows a configuration of the floating gate electrode 126 among the constituent elements of the memory cell 120 in the element formation region 10A. As shown in FIG. 5, two memory cells 120 are provided inside the element formation region 10A. The light-blocking wall 50 is provided surrounding this element formation region 10A. The light-blocking wall 50 does not surround the entire element formation region 10A but includes the aperture 52 as does in the first embodiment. Signal lines 26 and 27 of the memory cell 120 are drawn out from this aperture 52 to the outside of the element formation region 10A. The signal line 26 is electrically coupled to the p-channel type transistor 100C provided in the third region 10Z. Also, the signal line 27 is electrically coupled to the impurity region 128 of the first region 10X. The semiconductor device in FIG. 5 shows a case in which the signal lines 26 and 27 are drawn out in the same direction and from a single aperture 52.

The signal line 26 has a pattern containing the first section 26A that is located at the aperture 52 and the second section 26B that is located inside the aperture 52 and has the width larger than the width of the first section 26A. Similarly, the signal line 27 also has a pattern containing first section 27A and a second section 27B that is located inside the aperture 52 and has the width larger than the width of the first section 27A. Then, the signal lines 26 and 27 are patterned so that the entire width Y of the second sections 26B and 27B overlaps the width of the aperture 52. The embodiment shows a case in which the second sections 26B and 27B are provided outside the aperture 52 and on the side of the element formation region 10A. Similarly to the first embodiment, the signal lines 26 and 27 have the pattern in which the widths of the signal lines 26 and 27 become locally large by providing the branched portions 28 and 29. Accordingly, by providing the branched portions 28 and 29, the width Y combining the widths of the second sections 26B and 27B can be larger than the width of the aperture 52.

Next, a cross sectional configuration of the semiconductor device of the second embodiment will be described with reference to FIGS. 6A and 6B.

As shown in FIG. 6, with a semiconductor device 200, there is the memory cell 120 on the semiconductor layer of the element formation region 10A. As of a detailed structure of the memory cell 120, refer to the descriptions above.

As shown in FIGS. 6A and 6B, there are the first interlayer insulating layer 20 and the second interlayer insulating layer 30 provided, in this order, on the semiconductor layer 10 covering the memory cell 120. As shown in FIG. 6A, the signal line 26 is provided on the first interlayer insulating layer 20 in the region where the light-blocking wall 50 (see FIG. 5) is not provided, that is, the region that becomes the aperture 52. The signal line 26 is electrically coupled to the p-channel type transistor 100C of the third region 10Z of the memory cell 120.

Further, as shown in FIG. 6B, in a region that becomes the light blocking wall 50, the first metal layer 24 is provided on the first interlayer insulating layer 20, and the second metal layer 34 is provided on the second interlayer insulating layer 30. The contact layer 22 is provided between the semiconductor layer 10 and the first metal layer 24, and the via layer 32 is provided between the first metal layer 24 and the second metal layer 34. The contact layer 22 and the via layer 32 are layers formed by burying the conductive layer into the opening portions 22a and 32a that are provided in the first and second interlayer insulating layers 20 and 30. The opening portions 22a and 32a are groove-like openings formed to surround the element formation region 10A. Therefore, the entire contact layer 22 and via layer 32 are in a shape of a wall surrounding the element formation region 10A.

According to the semiconductor device of the second embodiment, because the light-blocking wall 50 is provided around the memory cell 120, it is possible to reduce the light entering from the lateral and upper diagonal directions. Further, when drawing out the signal lines 26 and 27 coupled to the memory cell 120 are drawn out from the aperture 52 of the light-blocking wall 50, it is possible to reduce the light entering from the aperture 52 by locally widening the width of the signal lines 26 and 27 by providing the second sections 26B and 27B, for example. As a result, it is possible to provide the semiconductor device having improved electric charge retaining characteristics and reliability.

Modified Example

Next, the semiconductor device of a modified example of the second embodiment will be described with reference to FIG. 7. FIG. 7 is a plan view of the semiconductor device of the modified example and is corresponding to FIG. 5.

With the semiconductor device of the modified example, the directions in which the signal lines 26 and 27 are drawn out differ from each other as shown in FIG. 7. In other words, the parts where the light-blocking wall 50 are not provided, that is, the apertures 52 and 54, are provided on different sides of the element formation region 10A. The signal line 26 is drawn out from the aperture 52, and the signal line 27 is drawn out from the aperture 54. The signal lines 26 and 27 have a pattern containing the second sections 26B and 27B, respectively, having the widths larger than the widths of the apertures 52 and 54, respectively. Accordingly, it is possible to reduce the light entering from the lateral and diagonal directions and to provide, as a result, the semiconductor device with improved electric charge retaining characteristics.

3. Third Embodiment

Figure 8:
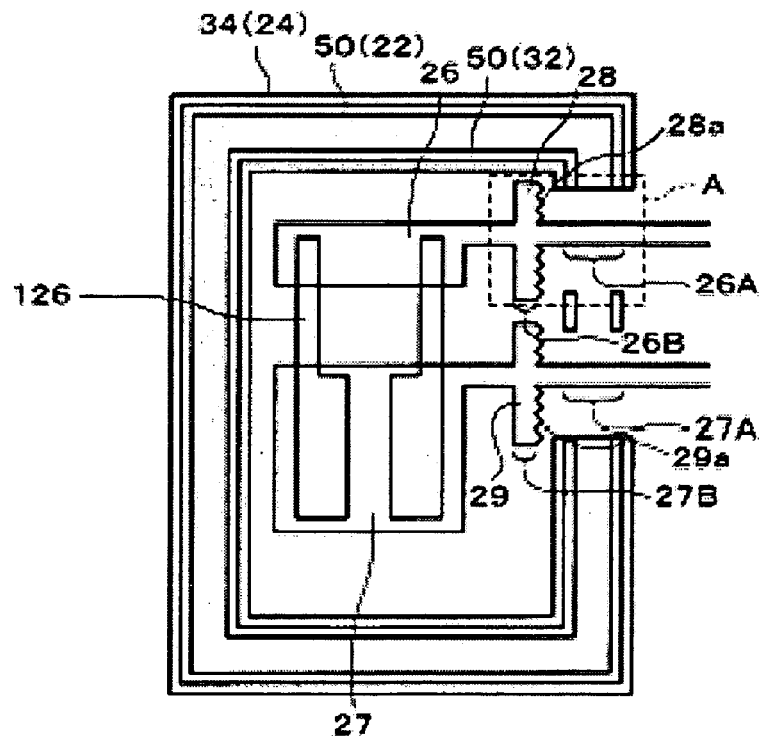
FIG. 8 is a plan view of the semiconductor device of a third embodiment.
Figure 9:
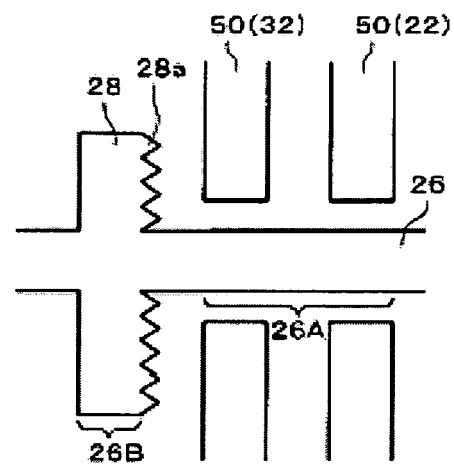
FIG. 9 is a plan view of an enlarged portion A of FIG. 8.

Next, the semiconductor device of the third embodiment will be described with reference to FIGS. 8 and 9. FIG. 8 is a plan pattern view of the semiconductor device of the third embodiment and is corresponding to FIG. 5. FIG. 9 is a plan view of an enlarged portion A of FIG. 8. As shown in FIG. 8, the semiconductor device of the third embodiment has a configuration of the second section 26B different from that of the semiconductor device of the previous embodiments. In the following, detailed descriptions of the same compositions as those in the previous embodiments will be omitted.

As shown in FIG. 8, the memory cell 120 is provided in the element formation region 10A. The element formation region 10A is covered by the light-blocking wall 50. The signal lines 26 and 27 electrically coupled to the memory cell 120 are drawn outside of the light-blocking wall 50 from the aperture 52 where the light-blocking wall 50 is not provided. The signal lines 26 and 27 include the branched portions 28 and 29 outside the aperture 52. As shown in FIG. 9, with the semiconductor device of the third embodiment, the surfaces, of the side surfaces of these branched portions 28 and 29, facing the light-entering direction have convex parts 28a and 29a. The convex parts 28a and 29a can take any configuration so long as the surface of the side surfaces of the branched portions 28 and 29 has an uneven height, and, for example, the tip of the convex part can be curved. Preferably, the convex parts 28a and 29a may have a pointed configuration composed of a plurality of sloped surfaces. FIGS. 8 and 9 show a case in which the convex parts 28a and 29a are arranged in line, each having a pointed configuration composed of two sloped surfaces.

According to the semiconductor device of the third embodiment, the side surfaces facing the light-entering direction of the second sections 26B and 27B positioned outside the aperture 52 (that is, the side surfaces of the branched portion 28 and 29) contain the convex parts 28a and 29a. Therefore, regardless the size of the angle of the incident light entering into the aperture 52, the semiconductor device of the embodiment can reflect the light and can further reduce the entering light. As a result, it is possible to suppress the characteristic changes and to provide the semiconductor device with the improved reliability. Further, when the convex parts 28a and 29a have the pointed configuration, it is possible to easily reflect the light entering diagonally towards the aperture 52.

4. Fourth Embodiment

Figure 10:
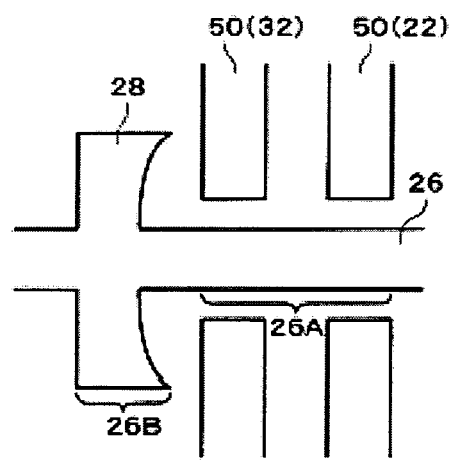
FIG. 10 is a plan view of the semiconductor device of a fourth embodiment.

FIG. 10 is a plan pattern view of the semiconductor device of the fourth embodiment and is corresponding to FIG. 9. As shown in FIG. 10, the semiconductor device of the fourth embodiment differs from those of the previous embodiments in the configuration of the second section. In the following, detailed descriptions of the same compositions as those in the previous embodiments will be omitted.

As shown in FIG. 10, with the semiconductor device of the fourth embodiment, the second section 26B has a concave configuration facing the light-entering direction. More specifically, the second section 26B has a structure including the branched portion 28 having a length Z that becomes greater as the distance between the branched portion 28 and the signal line 26 as the axis becomes greater, that is, that becomes greater towards the tip of the branched portion 28. Therefore, the overall configuration of the second section 26B has the concave curve facing the light-entering direction.

The semiconductor device of the fourth embodiment has the same advantage as that of the other embodiments, in that it enables reduction of the light entering from the lateral and upper diagonal directions. Further, the second section 26B has the concave curved surface facing the light-entering direction. Therefore, it is possible to reflect even the light entering from the upper diagonal direction towards the aperture 52 and to further reduce the entering light. As a result, it is possible to suppress the characteristic changes and to provide the semiconductor device with the improved reliability.

5. Fifth Embodiment

Figure 11:
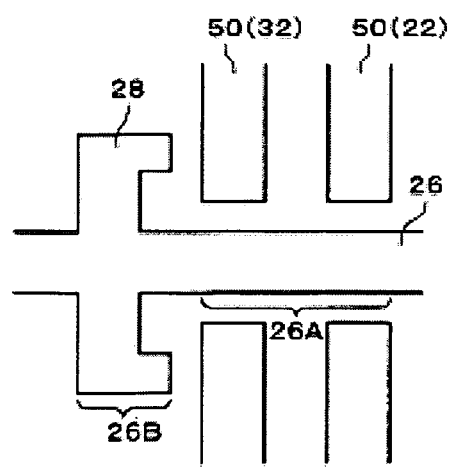
FIG. 11 is a plan view of the semiconductor device of a fifth embodiment.

FIG. 11 is a plan pattern view of the semiconductor device of the fifth embodiment and is corresponding to FIG. 9. As shown in FIG. 11, the semiconductor device of the fifth embodiment differs from those of the previous embodiments in the configuration of the second section. In the following, detailed descriptions of the same compositions as those in the previous embodiments will be omitted.

As shown in FIG. 11, with the semiconductor device of the fifth embodiment, the second section 26B has a concave configuration facing the light-entering direction. By making the branched portions 28 and 29 to be L shaped, for example, the overall configuration of the second section 26B can have the concave configuration.

The semiconductor device of the fifth embodiment has the same advantage as that of the other embodiments, in that it enables reduction of the light entering from the lateral and upper diagonal directions.

Additionally, the invention is not limited to the above-described embodiments and can be modified within the gist of the invention. For example, although it is illustrated in the embodiments that the two layers, the first and second interlayer insulating layers 20 and 30, are provided on the semiconductor elements, more than three interlayer insulating layers may be provided. In this case, in each interlayer insulating layer, the contact layer positioned surrounding the element formation region is to compose the light-blocking wall.

Further, although it is illustrated in the embodiments that the via layer 32 and the contact layer 22 composing the light-blocking wall 50 do not overlap each other, they may overlap. Furthermore, instead of the contact layer 22 and the via layer 32, an opening that penetrates the first and second interlayer insulating layers 20 and 30 may be provided, and a conductive material may be buried into this opening to produce the light-blocking wall 50.

Furthermore, FIG. 5 shows the case in which the signal lines 26 and 27 are drawn out of one aperture 52. However, there may be an aperture provided for each of the signal lines 26 and 27.

Moreover, although it is not illustrated in the embodiments that a light blocking film is provided to cover particularly the upper part of the element formation region 10A, it is naturally preferable to provide the light blocking film on the upper part of the element formation region 10A. In this case, it is possible to reduce the light entering from the lateral and upper diagonal directions and, further, to provide the semiconductor device with the improved reliability.

What is claimed is:

1. A semiconductor device, comprising:
   a semiconductor element provided on a semiconductor layer;
   a light-blocking wall provided around the semiconductor element; and
   a wiring layer electrically coupled to the semiconductor element and extended from an aperture not having the light-blocking wall to an outside of the light-blocking wall;
   wherein the wiring layer has a pattern containing a first section positioned in the aperture and a second section which has a width not narrower than a width of the aperture by providing a branched portion intersecting with an extension direction of the wiring layer; and
   wherein a surface of the section facing outside of the light-blocking wall is in a concave configuration.

2. The semiconductor device according to claim 1, wherein the concave configuration is a concave curve.

3. The semiconductor device according to claim 1, wherein the branched portion is in a configuration having a length that becomes larger towards the tip of this branched portion.

* * * * *